(12) United States Patent
Noguchi et al.

(10) Patent No.: US 11,765,824 B2
(45) Date of Patent: Sep. 19, 2023

(54) LAMINATED CERAMIC SINTERED BODY BOARD FOR ELECTRONIC DEVICE, ELECTRONIC DEVICE, CHIP RESISTOR, AND METHOD FOR MANUFACTURING CHIP RESISTOR

(71) Applicant: Panasonic Intellectual Property Management Co., Ltd., Osaka (JP)

(72) Inventors: Norimichi Noguchi, Osaka (JP); Masateru Mikami, Hyogo (JP); Kenji Toyoshima, Fukui (JP); Hiroki Oda, Fukui (JP); Daisuke Suetsugu, Osaka (JP); Tatsuya Urakawa, Fukui (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 17/357,159

(22) Filed: Jun. 24, 2021

(65) Prior Publication Data

US 2022/0030707 A1    Jan. 27, 2022

(30) Foreign Application Priority Data

Jul. 21, 2020  (JP) ................................ 2020-124577
May 11, 2021  (JP) ................................ 2021-080628

(51) Int. Cl.
| | |
|---|---|
| H05K 1/03 | (2006.01) |
| H01C 1/14 | (2006.01) |
| H01C 7/18 | (2006.01) |
| H01C 17/00 | (2006.01) |
| H05K 1/16 | (2006.01) |
| C04B 35/624 | (2006.01) |

(Continued)

(52) U.S. Cl.
CPC ............ *H05K 1/0306* (2013.01); *B32B 18/00* (2013.01); *C04B 35/44* (2013.01); *C04B 35/624* (2013.01); *H01C 1/14* (2013.01); *H01C 7/18* (2013.01); *H01C 17/006* (2013.01); *H05K 1/167* (2013.01); *C04B 35/04* (2013.01); *C04B 35/08* (2013.01); *C04B 35/581* (2013.01); *C04B 35/584* (2013.01)

(58) Field of Classification Search
CPC .......... H01C 1/14; H01C 7/17; H01C 17/006; H05K 1/0306; B32B 18/00; C04B 35/44; C04B 35/624
See application file for complete search history.

(56) References Cited

U.S. PATENT DOCUMENTS 5,563,764 A * 10/1996 Arakawa ................. H01G 4/38
361/321.1
9,041,202 B2 * 5/2015 Kimura .................... H01L 28/40
257/E29.147

(Continued)

FOREIGN PATENT DOCUMENTS

| JP | 10-122924 | 5/1998 |
|---|---|---|
| JP | 2017-168749 | 9/2017 |

(Continued)

*Primary Examiner* — Kyungslee
(74) *Attorney, Agent, or Firm* — Wenderoth, Lind & Ponack, L.L.P.

(57) ABSTRACT

A laminated ceramic sintered body board for an electronic device includes a ceramic sintered body board and a flattening film that is provided on an upper surface of the ceramic sintered body board and contains a thermally conductive filler, and the flattening film contains a thermally conductive filler.

10 Claims, 4 Drawing Sheets

(51) Int. Cl.
  *C04B 35/44* (2006.01)
  *B32B 18/00* (2006.01)
  *C04B 35/08* (2006.01)
  *C04B 35/584* (2006.01)
  *C04B 35/581* (2006.01)
  *C04B 35/04* (2006.01)

(56) References Cited

U.S. PATENT DOCUMENTS

2006/0023058 A1* 2/2006 Tanaka ............... H01L 27/12
                                              257/E27.111
2016/0308101 A1* 10/2016 Konishi .............. H01L 33/62
2020/0090843 A1  3/2020 Yoshida et al.

FOREIGN PATENT DOCUMENTS

| JP | 2017-168750 | 9/2017 |
| WO | 2018/190057 | 10/2018 |
| WO | 2019/188584 | 10/2019 |

* cited by examiner

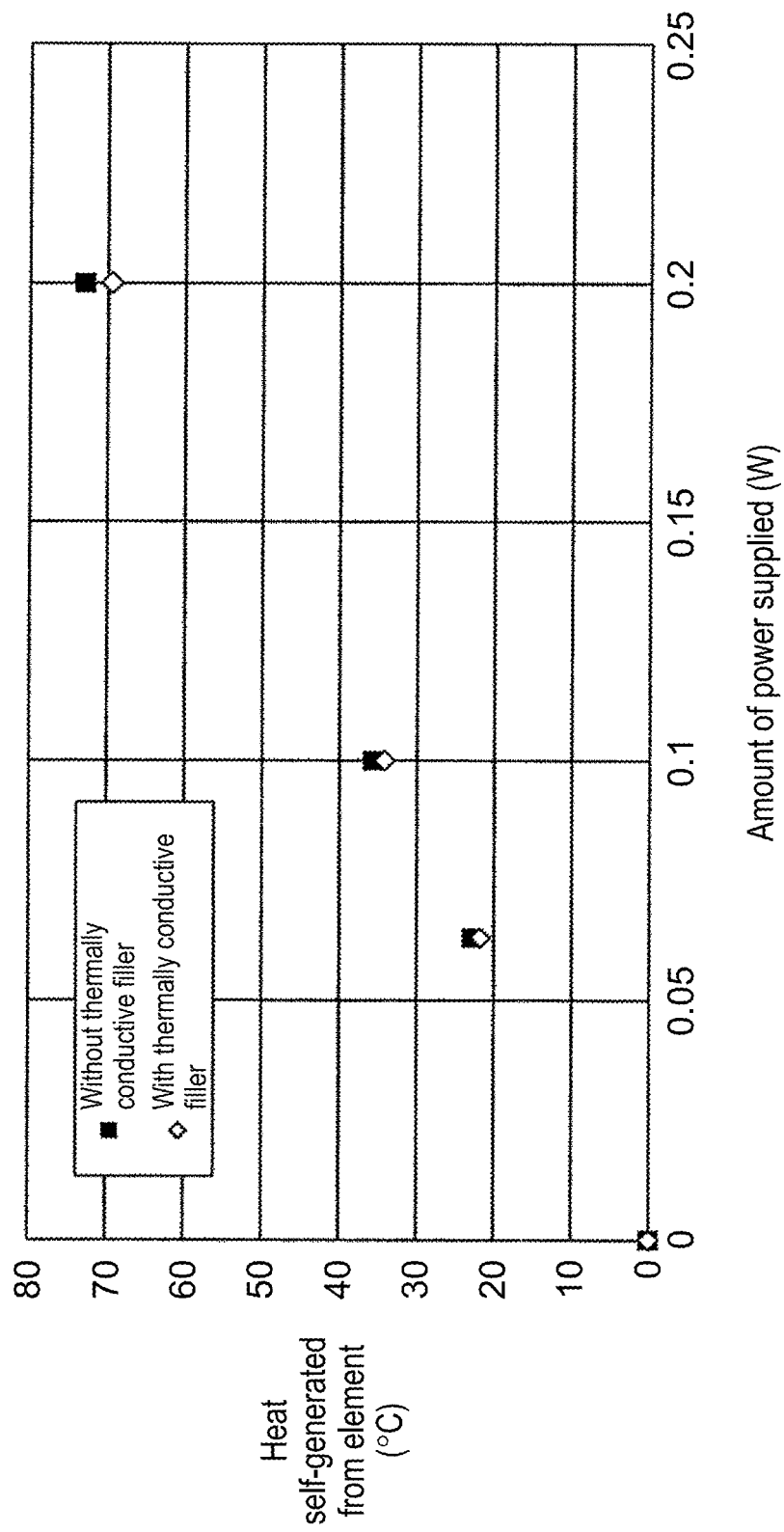

FIG. 6

(Table 1)

| Kind of ceramic sintered body board | Thermal conductivity [W/(m·K)] | Coefficient of linear expansion [×10⁻⁶/K] |
|---|---|---|
| Alumina board | 26 | 7.2 |
| Alumina-zirconia board | 27 | 7.1 |
| Silicon nitride board | 55 | 2.7 |
| Aluminum nitride board | 180 | 4.6 |
| Reference: glass board | 0.0109 | 3.2 |

FIG. 7

(Table 2)

| Material name | Thermal conductivity [W/(m·K)] | Coefficient of linear expansion [×10⁻⁶/K] |
|---|---|---|
| $SiO_2$(Molten) | 1.3 | 0.5 |
| $SiO_2$(Crystal) | 10 | 15 |
| $Al_2O_3$ | 32 | 6 |
| ZnO | 54 | 3.9 |
| MgO | 40-60 | 13 |
| BeO | 250 | 6.4 |
| h-AlN | 320 | 4.15 |
| h-BN | 200(Surface direction) | 2.0 |
| c-BN | 1300 | 4.7 |
| $Si_3N_4$(SiNx) | 80 | 2.6 |
| Diamond | 2300 | 2.3 |

LAMINATED CERAMIC SINTERED BODY BOARD FOR ELECTRONIC DEVICE, ELECTRONIC DEVICE, CHIP RESISTOR, AND METHOD FOR MANUFACTURING CHIP RESISTOR

BACKGROUND

1. Technical Field

The present disclosure relates to a laminated ceramic sintered body board for an electronic device, an electronic device, a chip resistor, and a method for manufacturing a chip resistor.

2. Description of the Related Art

Some electronic devices such as chip resistors are formed on a ceramic sintered body board exhibiting a high strength and an insulation property. For example, a thin film chip resistor includes an insulating board, a pair of upper electrodes provided on both ends of an upper surface of this insulating board, and a resistance element provided on the upper surface of the insulating board and connected between the pair of upper electrodes.

The chip resistor further includes a protective film provided so as to cover at least the resistance element, a pair of end surface electrodes provided on both end surfaces of the insulating board so as to be electrically connected to the pair of upper electrodes, and a plating layer formed on a part of the upper electrodes and the surfaces of the pair of end surface electrodes.

In the manufacturing of the above-described electronic device, structures including a resistance element and the like are formed on the surface of a large ceramic sintered body board and are then cut in a grid shape with a dicing blade or partitioned along partition grooves that are formed in advance on the ceramic sintered body board in a grid shape, thereby obtaining elements as individual pieces.

Because a ceramic sintered body board is produced by sintering ceramic particles together with a variety of binders, the surface of the ceramic sintered body board is not flat and instead has a fine unevenness or undulation attributed to the shapes of the ceramic particles. Therefore, there has been a problem in that the shape of a surface electrode or resistance element that is formed on the surface of the ceramic sintered body board is unlikely to be stable. For example, in the case of forming the surface electrode or resistance element on the surface of the ceramic sintered body board as a thin film by a film-forming process or photolithography, there has been a problem in that the surface electrode or resistance element, which is a thin film, is affected by the surface state of an alumina board, which causes local distortion, unevenness of the film thicknesses, cracks, or the like and makes characteristics vary or become poor.

In order to solve the above-described problem, for example, Japanese Patent Unexamined Publication No. 2017-168749 proposes a technique in which a small amount of silica glass is contained in an alumina board, a glass coating is formed on the entire surface of the alumina board, and an upper electrode, a resistance element, or the like is formed on the corresponding glass coating.

SUMMARY

A laminated ceramic sintered body board for an electronic device according to an exemplary embodiment of the present disclosure includes a ceramic sintered body board and a flattening film that is provided on an upper surface of the ceramic sintered body board and contains a thermally conductive filler.

BRIEF DESCRIPTION OF THE DRAWINGS

FIG. 5 is a view showing thermal simulation results for confirming an effect of a flattening film having a thermally conductive filler in an example;

FIG. 6 is a view for exemplifying ceramic sintered body boards; and

FIG. 7 is a view showing the thermal conductivities and the coefficients of linear expansion of typical ceramics and the like.

DETAILED DESCRIPTION

Figure 1:
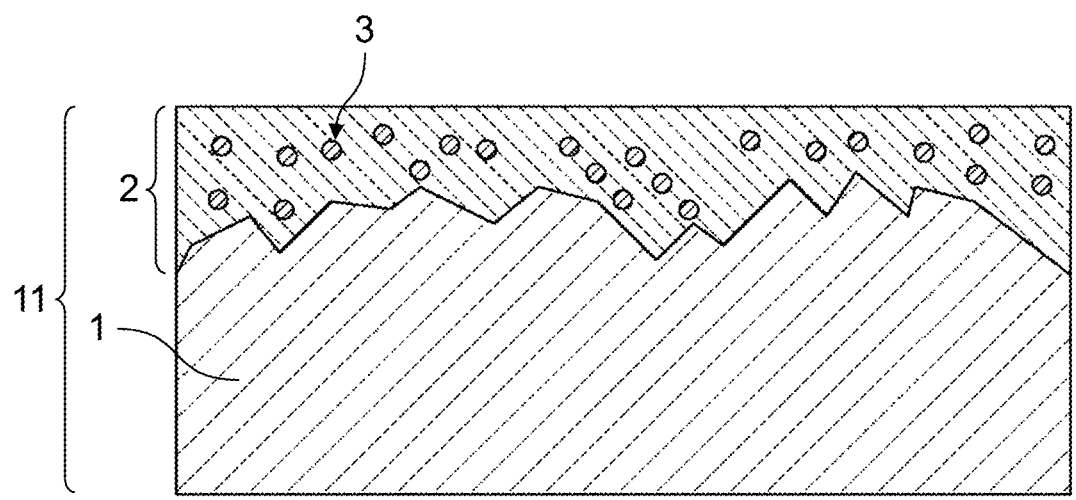
FIG. 1 is a schematic cross-sectional view of a laminated ceramic sintered body board for an electronic device according to one exemplary embodiment of the present disclosure.

In recent years, for electronic devices, there has been a desire for high reliability under harsh environments or an increase in the amount of power supplied as typically desired for applications in vehicles. Because this desire accordingly increases a thermal load on the element structure of an electronic device, the electronic device is required to appropriately dissipate heat to the outside.

In an alumina board and a glass coating layer that configure a chip resistor of Patent Document 1, the thermal conductivity of the alumina board is, for example, 26 W/(m·K), the thermal conductivity of glass ($SiO_2$) is, for example, approximately 0.01 W/(m·K), and the thermal conductivity of the glass coating layer is considerably smaller than the thermal conductivity of the alumina board. Therefore, in a case where a thermal load on an element structure is large, heat is not sufficiently dissipated, and consequently, the deterioration of the element characteristics and, furthermore, breakage may occur.

The present disclosure has been made in view of the above-described circumstances, and an object of the present disclosure is to provide an electronic device such as a chip resistor in which the heat dissipation property is excellent and an adverse influence on characteristics attributed to an unevenness of a surface of a ceramic sintered body board is suppressed, a method for manufacturing a chip resistor, and a laminated ceramic sintered body board that can be used in electronic devices such as chip resistors.

In order to realize electronic devices such as chip resistors in which the heat dissipation property is excellent and an adverse influence on characteristics attributed to an unevenness of the surface of a ceramic sintered body board is suppressed, intensive studies were carried out regarding laminated ceramic sintered body boards that can be used in, particularly, the electronic devices such as the chip resistors. As a result, it was found that the laminated ceramic sintered body board is preferably configured to include a ceramic sintered body board and a flattening film that is provided on an upper surface of the ceramic sintered body board and contains a thermally conductive filler. Hereinafter, "laminated ceramic sintered body board for an electronic device" will be simply referred to as "laminated ceramic sintered body board" in some cases.

According to an exemplary embodiment of the present disclosure, it is possible to provide an electronic device such as a chip resistor in which the heat dissipation property is excellent and an adverse influence on characteristics attributed to an unevenness of a surface of a ceramic sintered body board is suppressed, a method for manufacturing a chip resistor, and a laminated ceramic sintered body board that can be used in electronic devices such as chip resistors.

Hereinafter, a laminated ceramic sintered body board according to the exemplary embodiment of the present disclosure and a chip resistor including the laminated ceramic sintered body board will be described with reference to the drawings, respectively. The exemplary embodiment of the present disclosure is not limited to a form shown in the following drawings and can be appropriately changed as long as the effect of the present disclosure is not impaired. In the following description, the same components will be given the same reference sign and will not be described as appropriate.

Laminated Ceramic Sintered Body Board

First, the laminated ceramic sintered body board in the exemplary embodiment of the present disclosure will be described using FIG. 1. Laminated ceramic sintered body board 11 in one exemplary embodiment of the present disclosure has a configuration shown in FIG. 1. That is, in laminated ceramic sintered body board 11, flattening film 2 containing thermally conductive filler 3 is formed on the entire upper surface of ceramic sintered body board 1.

Ceramic Sintered Body Board

The kind of ceramics in ceramic sintered body board 1 is not limited, and examples of the ceramic sintered body board include an alumina board, an alumina-zirconia board, a silicon nitride board, an aluminum nitride board, and the like having physical properties shown in Table 1 of FIG. 6. The ceramic sintered body board is preferably an alumina board. Even with the same kind of ceramics, when the particle size of ceramic particles or the densities of the ceramic particles in a ceramic sintered body are different, physical properties that are different from the numeric values in Table 1 are exhibited in some cases.

Ceramic sintered body board 1 is manufactured by mixing a variety of ceramic particles and a binder and molding and sintering the mixture. The surface of the ceramic sintered body board has an unevenness attributed to the shapes of the ceramic particles that configure the sintered body. As an example of the ceramic sintered body board, an alumina board (A476) manufactured by Kyocera Corporation has surface roughness Ra of 0.3 to 0.5 micrometers, and an alumina board with a different product number (A493) has surface roughness Ra of 0.05 to 0.08 micrometers. In the exemplary embodiment of the present disclosure, a flattening film is provided on the upper surface of ceramic sintered body board 1 as follows, whereby it is possible to provide, for example, an upper electrode or a resistance element without being affected by the surface state of the ceramic sintered body board.

Flattening Film

In the exemplary embodiment of the present disclosure, flattening film 2 is formed on the upper surface of ceramic sintered body board 1. When flattening film 2 is formed, recesses on the surface of ceramic sintered body board 1 are filled with the material that configures flattening film 2, which makes the unevenness of the surface of flattening film 2 smaller than the unevenness of the surface of ceramic sintered body board 1. Therefore, according to the exemplary embodiment of the present disclosure, it is possible to form the upper electrodes or the resistance element on the surface of flattening film 2 in which an unevenness is suppressed without being affected by the surface state of ceramic sintered body board 1.

The material that configures the matrix (base) of flattening film 2 (hereinafter, referred to as "base material" in some cases) is not particularly limited. In the manufacture of flattening film 2, because flattening film 2 is fired at high temperatures, and the shape tends to change, the base material is preferably a material having a coefficient of thermal expansion that is slightly different from the coefficient of thermal expansion of the ceramic sintered body board. Examples of the matrix of flattening film 2 include silicon dioxide ($SiO_2$) and aluminum oxide ($Al_2O_3$).

Thermally Conductive Filler Contained in Flattening Film

A characteristic that is most required for thermally conductive filler 3 is a high thermal conductivity. There is a need to make the thermal conductivity high by the presence of thermally conductive filler 3 in flattening film 2 compared with a case where a flattening film not containing thermally conductive filler 3 is formed. Therefore, thermally conductive filler 3 needs to exhibit a higher thermal conductivity than the matrix of flattening film 2.

The material that configures thermally conductive filler 3 is not particularly limited as long as the material satisfies the above-described characteristic. As the thermally conductive filler, it is possible to use, for example, one or more kinds of compounds selected from the group consisting of zinc oxide (ZnO), magnesium oxide (MgO), beryllium oxide (BeO), aluminum nitride (AlN), boron nitride (BN), silicon nitride ($SiN_x$), and diamond.

Table 2 in FIG. 7 shows the thermal conductivities and the coefficients of linear expansion of typical ceramics and the like. In a case where the matrix of flattening film 2 is, for example, silica ($SiO_2$ (molten)), because the thermal conductivity of the matrix is 1.3 W/(m·K), there is a need to use a material having a thermal conductivity of higher than 1.3 W/(m·K) as the material that configures thermally conductive filler 3. In addition, in a case where the matrix of flattening film 2 is, for example, alumina ($Al_2O_3$), because the thermal conductivity of the matrix is 32 W/(m·K), there is a need to use a material having a thermal conductivity of higher than 32 W/(m·K) as the material that configures thermally conductive filler 3. Table 2 shows typical examples of the thermal conductivities and the coefficients of linear expansion of typical ceramics and the like, but the thermal conductivities and the coefficients of linear expansion, which will be described below, exhibit different values in some cases due to the manufacturing methods and structures of individual companies.

The size, for example, the average particle size of thermally conductive filler 3 is not particularly limited. Because the unevenness height of the surface of the ceramic sintered body board is on a several-micrometer level, the average particle size of thermally conductive filler 3 is preferably 10 μm or less and more preferably 2 μm or less. More preferably, the average particle size of thermally conductive filler 3 is smaller than or equal to the average particle size of ceramic particles that configure the matrix of flattening film 2. The reason therefor is that, in a case where the particle size of thermally conductive filler 3 is significantly larger than the size of the ceramic particles that configure the matrix of flattening film 2 or the unevenness height of the surface of ceramic sintered body board 1, the surface roughness of flattening film 2 becomes large, and there is a case where it becomes difficult to flatten the surface. The average particle size of the thermally conductive filler that is used to form the flattening film and the average particle size of the particles for forming the matrix can be measured by a dynamic light scattering method, a laser diffraction method, a BET method, the observation of a photograph with a scanning electron microscope (SEM) or a transmission electron microscope (TEM), or the like.

In the formation of the flattening film, a thermally conductive filler having an average particle size that is smaller than or equal to the average particle size of the particles for forming the matrix of the flattening film is preferably used, and, as such a thermally conductive filler, for example, a commercially available thermally conductive filler having an average particle size of several ten nanometers to several ten micrometers can be preferably used. The average particle size of thermally conductive filler 3 in flattening film 2 is substantially the same as the average particle size of the thermally conductive filler that is used to form the flattening film. The average particle size of thermally conductive filler 3 in flattening film 2 and the average particle size of the ceramic particles that configure the matrix of flattening film 2 can be measured by the observation of a photograph with a scanning electron microscope (SEM) or the like. In the measurement of the average particle size of thermally conductive filler 3 in flattening film 2, an element analysis may be combined in order to distinguish thermally conductive filler 3 and the matrix of flattening film 2.

The shape of thermally conductive filler 3 is not particularly limited. Examples of the shape of thermally conductive filler 3 include a spherical shape, a fibrous shape, a polygonal shape, a flat plate shape, a scale shape, and the like. Depending on the shape of thermally conductive filler 3, there is a case where the surface roughness becomes large when thermally conductive filler 3 appears on the outermost surface of flattening film 2. Therefore, the shape of thermally conductive filler 3 may be selected depending on the uneven shape of ceramic sintered body board 1, the thickness of flattening film 2, a desired thermal conductivity, and the like.

The thermally conductive filler is preferably electrically insulating. That is, the intrinsic volume resistance of the thermally conductive filler is preferably larger than $10^{+13}$ $\Omega/cm$. When there is a demand for an element characteristic such as voltage resistance as in chip resistors, in the case of using, for example, metal particles that are electrically conductive as the thermally conductive filler, the metal particles themselves serve as a conduction path, and the element characteristic such as voltage resistance are degraded, which is not preferable.

The percentage of thermally conductive filler 3 in flattening film 2 is not particularly limited. As the percentage of thermally conductive filler 3 in flattening film 2 increases, the thermal conductivity increases, but the proportion of the matrix of flattening film 2 decreases relatively, and the strength of flattening film 2 is likely to decrease. Therefore, the percentage of thermally conductive filler 3 in flattening film 2 may be appropriately determined depending on a thermal conductivity and a strength that are demanded for flattening film 2.

As thermally conductive filler 3, a plurality of kinds of thermally conductive fillers that are different in at least one of the material, the size, and the shape may be used. For example, in the case of combining thermally conductive fillers having different particle sizes or different particle shapes, an effect of filling voids in the flattening film is obtained, the effective density increases, and an effect of increasing the thermal conductivity is obtained.

On the surface of an ordinary ceramic sintered body board, there is a several-micrometer level unevenness. Therefore, the film thickness of the flattening film is preferably larger than or equal to the height of the unevenness of the ceramic sintered body board. While also depending on the height of the unevenness, the thickness of the flattening film is preferably 1.0 μm or more. The upper limit of the thickness of the flattening film is not particularly limited, but the thickness of the flattening film can be set to, for example, 20 μm or less.

The method for forming flattening film 2 containing thermally conductive filler 3 on ceramic sintered body board 1 is not particularly limited, but the flattening film is preferably formed by a sol-gel method from the viewpoint of efficiently packing the unevenness on the surface of the ceramic sintered body board with the material that configures flattening film 2 and the viewpoint of forming flattening film 2 in which thermally conductive filler 3 is dispersed. The sol-gel method is one of the ceramic synthesis methods and enables the production of the flattening film at low temperatures compared with a conventional melting method and sintering method. In addition, because a raw material in a solution state is used, it is possible to produce a flattening film having a thin film thickness.

In order to form flattening film 2 containing thermally conductive filler 3 according to the present disclosure, particles for forming the matrix of flattening film 2 and thermally conductive filler 3 intended to improve the thermal conductive property of the flattening film are mixed into a sol solution.

In the formation of the flattening film, as described above, it is preferable to use a thermally conductive filler having an average particle size that is smaller than or equal to the average particle size of the particles for forming the matrix of the flattening film and thereby easily flatten the surface.

On thermally conductive filler 3, a variety of pretreatments such as surface modification may be carried out in advance before thermally conducive filler 3 is mixed with the particles for forming the matrix of flattening film 2. Examples of the pretreatment include a hydrophilization treatment, a hydrophobization treatment, the adjustment of surface charge, and the like. The pretreatment makes it possible to obtain an advantage of the thermal conductivity of the flattening film becoming uniform by improving the dispersibility of the thermally conductive filler.

Electronic Device

The exemplary embodiment of the present disclosure includes an electronic device including the laminated ceramic sintered body board for an electronic device. As the electronic device, a chip resistor is an exemplary example.

Figure 2:
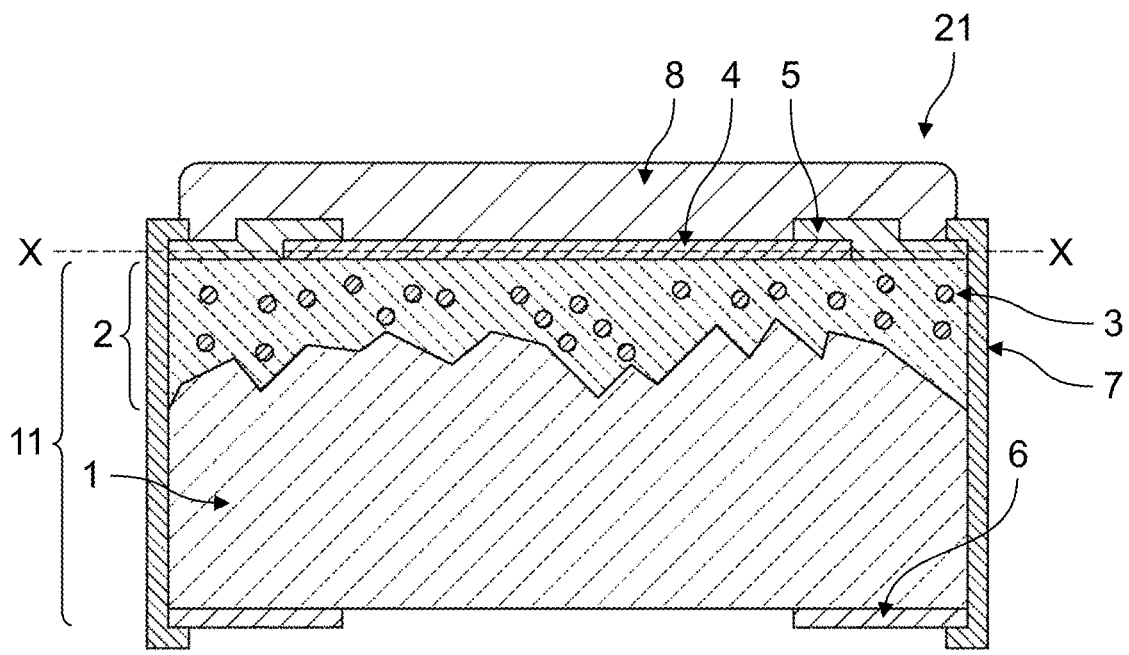
FIG. 2 is a schematic cross-sectional view of a chip resistor according to one exemplary embodiment of the present disclosure.
Figure 3:
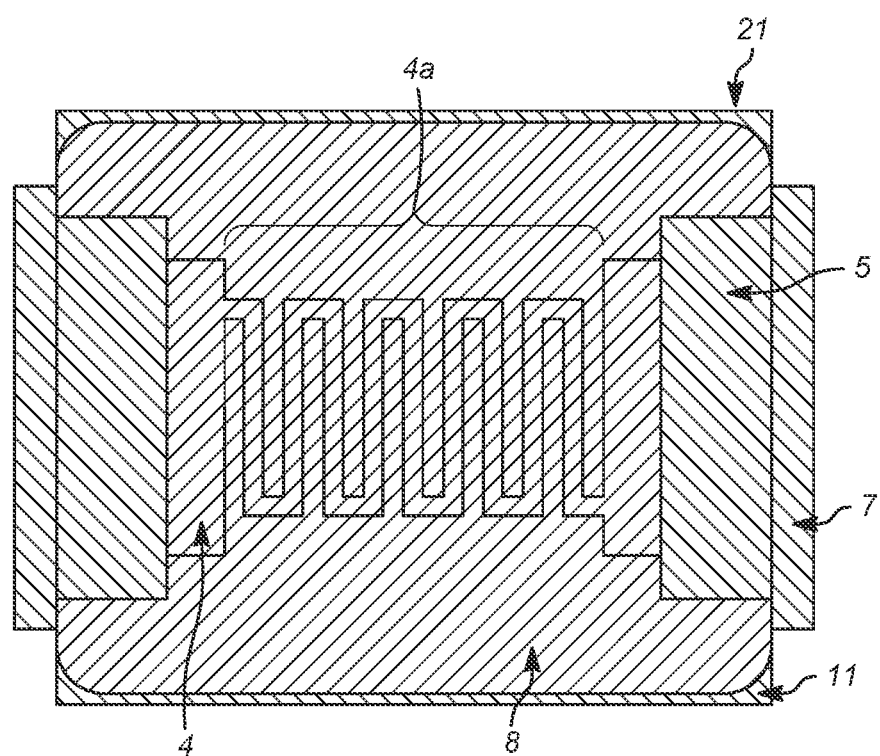
FIG. 3 is a schematic cross-sectional view of the chip resistor according to one exemplary embodiment of the present disclosure taken along a line X-X in FIG. 2.

A chip resistor in one exemplary embodiment of the present disclosure will be described using FIG. 2 and FIG. 3. FIG. 2 is a schematic cross-sectional view of the chip resistor according to one exemplary embodiment of the present disclosure, and FIG. 3 is a schematic cross-sectional view taken along a line X-X in FIG. 2. The chip resistor can be obtained by forming a resistance element or the like on laminated ceramic sintered body board 11 shown in FIG. 1. Therefore, the contents relating to laminated ceramic sintered body board 11 of FIG. 2 will not be described.

Chip resistor 21 in one exemplary embodiment of the present disclosure has a configuration shown in FIG. 2. That is, chip resistor 21 is configured to include laminated ceramic sintered body board for electronic device 11 including ceramic sintered body board 1 and flattening film 2 containing thermally conductive filler 3, resistance element 4 and a pair of upper electrodes 5 provided on a surface of flattening film 2 opposite to ceramic sintered body board 1, and a pair of end surface electrodes 7 provided in the lamination direction of laminated ceramic sintered body board 11 and upper electrodes 5 so as to be in contact with the ends of laminated ceramic sintered body board 11 and upper electrodes 5.

Resistance element 4 is provided on the upper surface of laminated ceramic sintered body board 11 and is connected between the pair of upper electrodes 5. The pair of upper electrodes 5 are provided at both ends of an upper surface of laminated ceramic sintered body board for electronic device 11 on which resistance element 4 is formed. As shown in FIG. 2, a pair of lower electrodes 6 may be provided at both ends of a back surface opposite to the upper surface of laminated ceramic sintered body board 11. The pair of end surface electrodes 7 are provided on both end surfaces of laminated ceramic sintered body board 11 so as to be electrically connected to the pair of upper electrodes 5. Chip resistor 21 exemplified in FIG. 2 is provided with lower electrodes 6, but the chip resistor according to the present disclosure may not be provided with lower electrodes 6.

For resistance element 4, a material that satisfies a desired specific resistance or temperature coefficient of resistance (TCR) can be selected. An example is a material having a small TCR which is made of a thin film material containing four elements of Ni, Cr, Al, and Si as main components and in which the Ni/Cr ratio is set to 45/55 to 55/45 in terms of the weight ratio, the content of Al is set to 10% to 18% by weight of the total weight, and the content of Si is set to 2% to 6% by weight of the total weight. A different example of the material that configures the resistance element is a material having a large TCR. Examples of the material having a large TCR include pure metals of each metal of Pt, Ni, and Cu and alloys containing 50% by mass or more of each metal, for example, a Pt—Co alloy. Resistance elements formed of these materials do not only exhibit a function as a chip resistor but also can be used as a resistance element for temperature measurement.

Resistance element 4 may be provided with a trimming groove for adjusting the resistance value, and resistance element 4 may have meander structure (snaky shape) 4a as shown in FIG. 3.

Heat generated from resistance element 4 travels through, as a main path, resistance element 4 or laminated ceramic sintered body board 11 below resistance element 4 and is dissipated from end surface electrodes 7 to a board on which chip resistor 21 is mounted. Between resistance element 4 and laminated ceramic sintered body board 11, for resistance element 4, a material is determined depending on a required electrical characteristic, which makes it difficult to determine the material from the viewpoint of improving the heat dissipation property. Therefore, in order to enhance the heat dissipation property of the chip resistor for the purpose of expanding the operating temperature range or increasing the amount of power supplied, it is useful to enhance the heat dissipation performance of laminated ceramic sintered body board 11, which is another path.

Particularly, in a case where resistance element 4 has meander structure 4a, when heat generated from resistance element 4, particularly, the center of the structure of meander structure 4a is dissipated only through the resistance element, the generated heat needs to travel through an extremely long path in the resistance element. In a case where it is difficult to dissipate heat only from the resistance element as described above, according to the exemplary embodiment of the present disclosure in which laminated ceramic sintered body board 11 is in contact with resistance element 4, the heat dissipation property is enhanced, and the effect of the exemplary embodiment of the present disclosure is sufficiently exhibited.

The thickness of flattening film 2 is preferably larger than the thickness of resistance element 4. In such a case, the thermal capacity of flattening film 2 becomes larger than the thermal capacity of resistance element 4, consequently, the temperature of flattening film 2 is likely to become lower than the temperature of resistance element 4, and it is possible to efficiently dissipate heat.

Upper electrodes 5 are not particularly limited as long as upper electrodes 5 satisfy a target characteristic of the resistor. Examples of upper electrodes 5 include thin film electrodes made of Cu, a Cu-based alloy such as CuNi, or the like. The thin film electrode can be formed by, for example, sputtering, electron beam deposition, resistance heating vapor deposition, or the like. In order to improve the adhesion between the thin film electrode and flattening film 2, a thin metal film of Cr, Ti, Ni, or the like may be provided as an adhesive layer below the thin film electrode.

In the case of providing lower electrodes 6 as shown in FIG. 2, lower electrodes 6 are not particularly limited as long as lower electrodes 6 satisfy the target characteristic of the resistor. Examples of lower electrodes 6 include thin film electrodes made of Cu, a Cu-based alloy such as CuNi, or the like. The thin film electrode can be formed by, for example, sputtering, electron beam deposition, resistance heating vapor deposition, or the like. In order to improve the adhesion between the thin film electrode and ceramic sintered body board 1, a thin metal film of Cr, Ti, Ni, or the like may be provided as an adhesive layer below the thin film electrode.

The pair of end surface electrodes 7 are electrodes that are provided on both end surfaces of laminated ceramic sintered body board 11 and are electrically connected to the upper surfaces of the pair of upper electrodes 5 and are formed of, for example, Ag. End surface electrodes 7 can be formed by, for example, printing a material made up of Ag and a resin. Alternatively, end surface electrodes 7 can be formed by sputtering a metal material. In the case of forming the pair of lower electrodes 6, the pair of end surface electrodes 7 are also connected to the pair of lower electrodes 6.

In order to enhance the heat dissipation effect of laminated ceramic sintered body board 11, it is preferable that at least any of upper electrodes 5 and end surface electrodes 7 are in contact with flattening film 2, and it is more preferable that both upper electrodes 5 and end surface electrodes 7 are in contact with flattening film 2. As the contact area between flattening film 2 and upper electrode 5 and the contact area between flattening film 2 and end surface electrode 7, particularly, the contact area between flattening film 2 and end surface electrode 7 increases, a larger amount of heat migrates from flattening film 2 to end surface electrodes 7, which is the final heat dissipation path, and it becomes possible to more effectively dissipate the heat.

Protective film 8 is formed to protect resistance element 4 from oxygen and humidity. As the material of protective film 8, it is possible to use a resin, an inorganic compound such as $Al_2O_3$ or SiNx, or the like. In addition, both a resin and an inorganic compound may also be used.

Although not shown in FIG. 2 and FIG. 3, a plating layer may be further formed on the upper surface of end surface electrode 7. This plating layer can be formed by a method that is ordinarily carried out.

According to the laminated ceramic sintered body board in the exemplary embodiment of the present disclosure, it is possible to effectively release heat generated from an element structure that is formed on the ceramic sintered body board to the outside and to suppress an adverse influence attributed to the unevenness of the ceramic sintered body board. Therefore, the use of the laminated ceramic sintered body board according to the exemplary embodiment of the present disclosure in an electronic device makes it possible to improve the temperature characteristic of the electronic device or to suppress the generation of an element defect. In addition, when the laminated ceramic sintered body board according to the exemplary embodiment of the present disclosure is used as a resistor, it is possible to expand the temperature range within which the resistor can be used or to expand the nominal power.

EXAMPLE

Hereinafter, the exemplary embodiment of the present disclosure will be more specifically described using examples. The exemplary embodiment of the present disclosure is not limited by the following examples, can also be appropriately modified and then carried out within the scope of the gist described above and to be described below, and such modifications are also all included in the technical scope of the present disclosure.

Example 1

A laminated ceramic sintered body board was produced by the following manufacturing method.

First, as a ceramic sintered body board, an alumina board that was excellent in terms of the heat resistance or the insulation property and was procurable at low costs was used.

A flattening film was formed on the ceramic sintered body board as follows. First, AlN nanoparticles (central particle size: 100 nm, measured by photographic observation with a scanning electron microscope (SEM)) produced by a thermal plasma method were added to polysilazane (NN120, manufactured by Merck Group) and stirred to be uniformly dispersed, thereby preparing a solution for forming a flattening film. In addition, this solution for forming a flattening film was treated with a spin coater at a rotation speed of 3000 rpm for 20 seconds. After that, the solution was dried on a hot plate set to 100° C. for 30 seconds and then fired at 700° C. for 12 hours in an electric drying furnace, thereby forming a flattening film in which the AlN nanoparticles were contained as a thermally conductive filler and the base was silicon dioxide.

Figure 4:
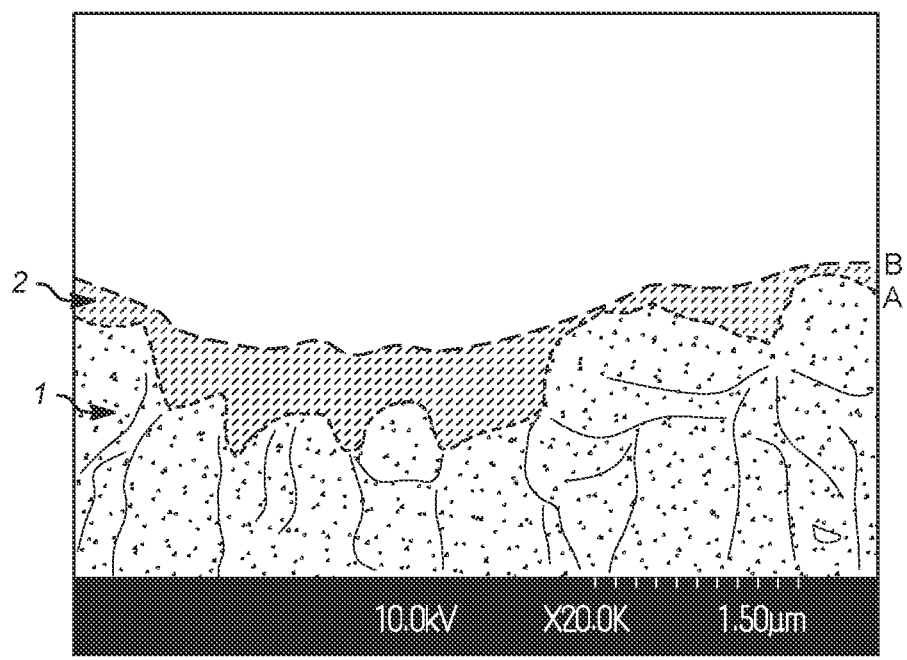
FIG. 4 is a view showing an example of a scanning electron microscopic observation photograph of a cross section of the laminated ceramic sintered body board for an electronic device in an example.

A cross section of the laminated ceramic sintered body board including the flattening film on the ceramic sintered body board obtained as described above was observed with a scanning electron microscope (S-5000, Hitachi High-Tech Corporation). An example of the scanning electron microscopic observation photograph is shown in FIG. 4. From FIG. 4, it was confirmed that, in the laminated ceramic sintered body board according to the exemplary embodiment of the present disclosure, the unevenness of the surface of the alumina board indicated by the broken line A was filled with the material that configured the flattening film, and, as indicated by the broken line B, the surface of the flattening film became flatter than the surface of the alumina board indicated by the broken line A.

Example 2

A resistance element or the like was formed on the laminated ceramic sintered body board produced in Example 1 as follows, thereby producing a chip resistor.

A thin film made of an NiCrAlSi alloy was produced on the flattening film of the laminated ceramic sintered body board by sputtering, and subsequently, a pattern was formed by photolithography (resist application, drying, exposure, development, etching, and resist peeling) to process the thin film into a meander structure, thereby obtaining a resistance element. After that, a heat treatment was carried out at 300° C. for five hours in order to obtain a predetermined temperature coefficient of resistance (TCR).

Furthermore, upper electrodes were formed on the flattening film as follows. First, a CuNi alloy film was formed on the flattening film by a sputtering method, and then the above-described photolithography was carried out. It is also possible to form the film only in a required region with a metal mask by forming the film by the sputtering method in place of the photolithography.

Furthermore, lower electrodes were formed on the surface of the alumina board opposite to the upper electrode-formed surface in the same manner as the upper electrodes. That is, a CuNi alloy film was formed by a sputtering method, and then the above-described photolithography was carried out. It is also possible to form the film only in a required region with a metal mask by forming the film by the sputtering method in place of the photolithography.

Next, a metal oxide film was formed on the resistance element as a protective film by sputtering. In the present exemplary embodiment, an $Al_2O_3$ film was formed as the protective film, but a metal oxide film other than $Al_2O_3$, $SiN_x$, or the like may be formed as long as protective performance can be fulfilled.

In the steps described above, a plurality of laminates of the resistance element, the upper electrodes, the lower electrodes, and the protective film were formed on the large alumina board for efficiency.

Next, in order to obtain individual chip resistors, the large alumina board on which the plurality of laminates was formed was cut by dicing to produce individual chips. In addition, in order to form end surface electrodes of each chip, a conductive paste containing Ni-based metal particles or Ag-based metal particles and a resin as a binder was applied and cured on the ends of the laminated ceramic sintered body board, the upper electrodes, and the lower electrodes, and furthermore, an electroplating treatment was carried out to form an Ni layer and an Sn layer, thereby obtaining a chip resistor.

Example 3

A thermal simulation was carried out to estimate the effect of the chip resistor. ANSYS (manufactured by ANSYS, Inc.) was used as simulation software.

The thermal simulation was carried out in a state where the chip resistor was mounted on a Cu-landed pattern on a printed board by soldering. The size of the chip resistor was 1 mm×0.5 mm×0.3 mm. The main configuration of the chip resistor was the same as the configuration of Example 2. Specifically, an alumina board was used as the ceramic sintered body board, and a flattening film on the alumina board had a film thickness of 5 μm and a thermal conductivity of 120 W/(m·K). A resistance element on the flattening film had a film thickness of 1 μm and a thermal conductivity of 120 W/(m·K), CuNi was used for upper electrodes, and Ni was used for end surface electrodes. In Example 3, unlike Example 2, the lower electrodes were not formed, but the presence or absence of the lower electrodes does not significantly affect the amount of heat self-generated from an element that is obtained by the thermal simulation.

In addition, as a comparative example, the simulation was carried out on a model in which an alumina layer that did not contain any thermally conductive filler and had a thermal conductivity of 26 W/(m·K) (thermal conductivity of alumina) and a film thickness of 5 μm was used as the flattening film. The results are shown in FIG. 5.

FIG. 5 shows the static simulation results of a case where the flattening film containing a thermally conductive filler and having a thermal conductivity of 120 W/(m·K) was formed and a case where the flattening film containing no thermally conductive filler and having a thermal conductivity of 26 W/(m·K) was formed. It was confirmed that, at an amount of power supplied of 0.2 W, which is approximately 3.2 times the assumed nominal amount of power supplied, the amount of heat self-generated from an element decreased by approximately 4.8% from 72.9° C., which was the amount of heat self-generated from an element in the case of containing no thermally conductive filler, to 69.5° C., which was the amount of heat self-generated from an element in the case of containing the thermally conductive filler. It was possible to verify the effect of the exemplary embodiment of the present disclosure in this manner.

In Example 3, the film thickness of the resistance element was set to 1 μm due to a limitation on the simulation; however, in actual chip resistors, there is a case where the film thickness of the resistance element is as thin as several ten nanometers. In a case where the film thickness is thin as described above, it is not possible to expect heat to be dissipated through only the resistance element; however, in such a case, it is considered that the effect of a favorable heat dissipation property exhibited by the laminated ceramic sintered body board of the present disclosure is more significantly exhibited.

Example 4

In Example 4, a chip resistor including a laminated ceramic sintered body board having the same structure as in Example 1 and Example 2 was obtained except that the material that configured the resistance element was Pt and the conditions for the etching, the heat treatment, and the like in the steps were changed accordingly. It was possible to confirm that the configuration of the corresponding chip resistor was capable of realizing flattening and to confirm that it was possible to measure temperatures by taking advantage of a large TCR of the resistance element. Furthermore, it was possible to confirm that, because the thermal conductivity of the laminated ceramic sintered body board itself was high, the responsiveness of the resistance value to external temperature changes improved.

In the laminated ceramic sintered body board of the present disclosure, the heat dissipation property is excellent and an adverse influence on characteristics attributed to the unevenness of the ceramic sintered body board is suppressed. Therefore, the present disclosure is useful as a board component that is used in electronic devices. In addition, the present disclosure is also useful as a chip resistor in which the laminated ceramic sintered body board is used.

What is claimed is:

1. A laminated ceramic sintered body board for an electronic device, the laminated ceramic sintered body comprising:
a ceramic sintered body board; and
a flattening film provided on an upper surface of the ceramic sintered body board, the flattening film containing a thermally conductive filler,
wherein the thermally conductive filler is one or more kinds of compounds selected from the group consisting of zinc oxide (ZnO), magnesium oxide (MgO), beryllium oxide (BeO), boron nitride (BN), silicon nitride (SiNx), and diamond, and
a matrix of the flattening film includes silicon dioxide ($SiO_2$) or aluminum oxide ($Al_2O_3$).

2. The laminated ceramic sintered body board of claim 1, wherein the ceramic sintered body board is an alumina sintered body board.

3. The laminated ceramic sintered body board of claim 1, wherein the thermally conductive filler is electrically insulating.

4. An electronic device comprising:
the laminated ceramic sintered body board of claim 1.

5. A chip resistor comprising:
a laminated ceramic sintered body board for an electronic device, the laminated ceramic sintered body comprising:
a ceramic sintered body board;
a flattening film provided on an upper surface of the ceramic sintered body board, the flattening film containing a thermally conductive filler,
wherein the thermally conductive filler is one or more kinds of compounds selected from the group consisting of zinc oxide (ZnO), magnesium oxide (MgO), beryllium oxide (BeO), aluminum nitride (AlN), boron nitride (BN), silicon nitride (SiNx), and diamond, and
a matrix of the flattening film includes silicon dioxide ($SiO_2$) or aluminum oxide ($Al_2O_3$);
a resistance element and a pair of upper electrodes, the resistance element and the pair of upper electrodes each being provided on a first surface of the flattening film of the laminated ceramic sintered body board, the first surface being opposite to a second surface of the flattening film, the second surface being on the ceramic sintered body board; and
a pair of end surface electrodes arranged in a lamination direction of the laminated ceramic sintered body board and the upper electrodes and being in contact with ends of the laminated ceramic sintered body board and the upper electrodes.

6. The chip resistor of claim 5,
wherein a thickness of the flattening film is larger than a thickness of the resistance element.

7. The chip resistor of claim 5,
wherein the resistance element has a meander structure.

8. The chip resistor of claim 5,
wherein the flattening film is in contact with at least any of the upper electrodes and the end surface electrodes.

9. A method for manufacturing the chip resistor of claim 5, method comprising:
forming the flattening film by a sol-gel method.

10. The method of claim 9,
wherein, in formation of the flattening film, a thermally conductive filler having an average particle size that is smaller than or equal to an average particle size of particles for forming a matrix of the flattening film is used.

* * * * *